(12) United States Patent
Hsieh

(10) Patent No.: US 7,872,306 B2
(45) Date of Patent: Jan. 18, 2011

(54) STRUCTURE OF TRENCH MOSFET AND METHOD FOR MANUFACTURING THE SAME

(76) Inventor: Fu-Yuan Hsieh, 13F, No. 111-5, Singde Rd., Sanchong City, Taipei County (TW)

( * ) Notice: Subject to any disclaimer, the term of this patent is extended or adjusted under 35 U.S.C. 154(b) by 615 days.

(21) Appl. No.: 11/847,445

(22) Filed: Aug. 30, 2007

(65) Prior Publication Data

US 2008/0169505 A1 Jul. 17, 2008

Related U.S. Application Data

(60) Provisional application No. 60/885,070, filed on Jan. 16, 2007.

(51) Int. Cl.
*H01L 29/78* (2006.01)
*H01L 21/336* (2006.01)

(52) U.S. Cl. ............... 257/331; 438/272; 257/E29.136; 257/E21.419

(58) Field of Classification Search .................. 257/330, 257/E29.136, E21.409, E21.418, E21.419
See application file for complete search history.

(56) References Cited

U.S. PATENT DOCUMENTS

| | | | |
|---|---|---|---|
| 6,444,528 B1 * | 9/2002 | Murphy | 438/270 |
| 6,462,376 B1 | 10/2002 | Wahl et al. | 257/331 |
| 6,489,652 B1 * | 12/2002 | Jeon et al. | 257/330 |
| 6,888,196 B2 * | 5/2005 | Kobayashi | 257/330 |
| 6,984,864 B2 * | 1/2006 | Uno et al. | 257/382 |
| 7,646,058 B2 * | 1/2010 | Hshieh | 257/328 |
| 2001/0020720 A1 * | 9/2001 | Hueting et al. | 257/331 |
| 2005/0087800 A1 * | 4/2005 | Sugi et al. | 257/328 |
| 2005/0145899 A1 * | 7/2005 | Fujii | 257/288 |
| 2006/0273382 A1 * | 12/2006 | Hshieh | 257/330 |
| 2009/0108343 A1 * | 4/2009 | Nemtsev et al. | 257/330 |

* cited by examiner

*Primary Examiner*—Colleen A Matthews
(74) *Attorney, Agent, or Firm*—Alan Kamrath; Kamrath & Associates PA

(57) ABSTRACT

A trench MOSFET with copper metal connections includes a substrate provided with a plurality of trenches. A gate oxide layer is formed on the sidewalls and bottoms of the trenches. A conductive layer is filled in the trenches to be used as a gate of the MOSFET. A plurality of source and body regions are formed in an epi layer. An insulating layer is formed on the epi layer and formed with a plurality of metal contact holes therein for contacting respective source and body regions. A barrier metal layer is formed on the sidewalls and bottoms of the metal contact holes in direct contact with respective source and body regions. A metal contact layer is filled in the metal contact holes. A copper metal layer is formed on another barrier metal layer on the insulating layer connected to respective source regions through the metal contact layer to form metal connections of the MOSFET.

18 Claims, 10 Drawing Sheets

STRUCTURE OF TRENCH MOSFET AND METHOD FOR MANUFACTURING THE SAME

CROSS REFERENCE

This application claims the benefit of provisional application No. 60/885,070 filed on Jan. 16, 2007.

BACKGROUND OF THE INVENTION

1. Field of the Invention

The present invention relates to a trench MOSFET and, more particularly, to a structure of a trench MOSFET with improved thermal conduction and a method for manufacturing the same.

2. Description of the Prior Art

In the structure of a trench Metal-Oxide-Semiconductor Field Effect Transistor (MOSFET) or vertical transistor, the gate of the transistor is formed in a trench on top of a substrate, and the source/drain regions of the transistor are formed on both sides of the gate. This type of vertical transistor allows high current to flow therethrough and turns on/off at a low gate voltage.

Referring to FIG. 1, a cross-sectional diagram of the structure of a trench MOSFET is shown. An N-type doping epitaxial region 105 is provided on an N+substrate 100. A plurality of trenches are formed in the region 105. The region 105 has a lower doping concentration than the substrate 100. A gate oxide layer 115 and gates 130 are covered in the trenches. P-type doping regions (hereinafter call P-body) 110 are formed on both sides of the gates 130. N+doping regions 125 are formed in the P-body 110 in active regions used as the source regions of the transistor. Metal connections for the gates 130, P-body 110 and N+doping regions 125 are formed from tungsten metal plugs 145 and barrier layers 140 in an insulating layer 135. An aluminum alloy metal layer 150 above the tungsten metal plug 145 is used as a second layer of metal connection. However, using the aluminum alloy metal plug as the metal connections in the trench MOSFET may cause poor thermal conduction as the size of the transistor shrinks.

Prior arts (U.S. Pat. Nos. 6,462,376 and 6,888,196) have 2-dimensional source contact with a tungsten plug which is connected with aluminum alloys as a front metal. The metal system has a thermal conduction issue when the die size shrinks as a result of increasing cell density.

The present invention provides a new structure of trench MOSFET, which uses copper as a front metal structure and which has better contact and thermal conduction than the prior art.

SUMMARY OF THE INVENTION

This invention provides a trench Metal-Oxide-Semiconductor Field Effect Transistor (MOSFET) with copper metal connections which have about two times higher thermal and electrical conductivity than aluminum alloys. A substrate is provided with a plurality of trenches. A gate oxide layer is formed on the sidewalls and bottoms of the trenches. A conductive layer is filled in the trenches to be used as a gate of the MOSFET. A plurality of source and body regions are formed in the epi layer. An insulating layer is formed on the epi layer and formed with a plurality of metal contact holes therein for contacting respective source and body (means P-body) regions. A first barrier metal layer is formed on the sidewalls and bottoms of the metal contact holes in direct contact with respective source, drain and gate regions. A metal contact layer is filled in the metal contact holes. A second barrier metal layer is formed on the insulating layer. A copper metal layer is formed on the second barrier metal layer connected to respective source, drain and gate regions through the metal contact layer to form metal connections of the MOSFET.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Figure 1:
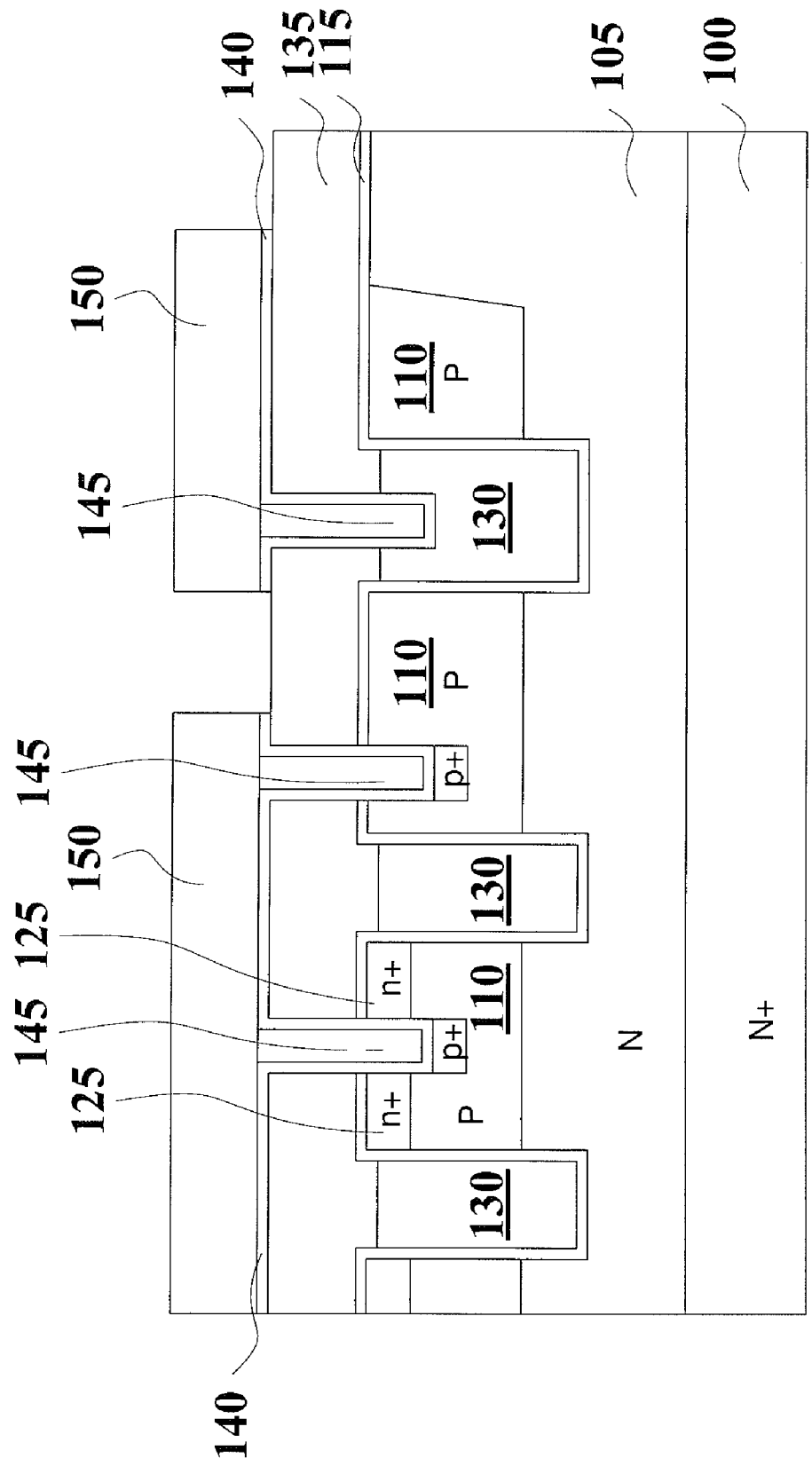
FIG. 1 is a cross-sectional diagram depicting a trench MOSFET using tungsten metal and aluminum metal as metal connections for the source/drain and gate regions of the MOSFET.
Figure 2:
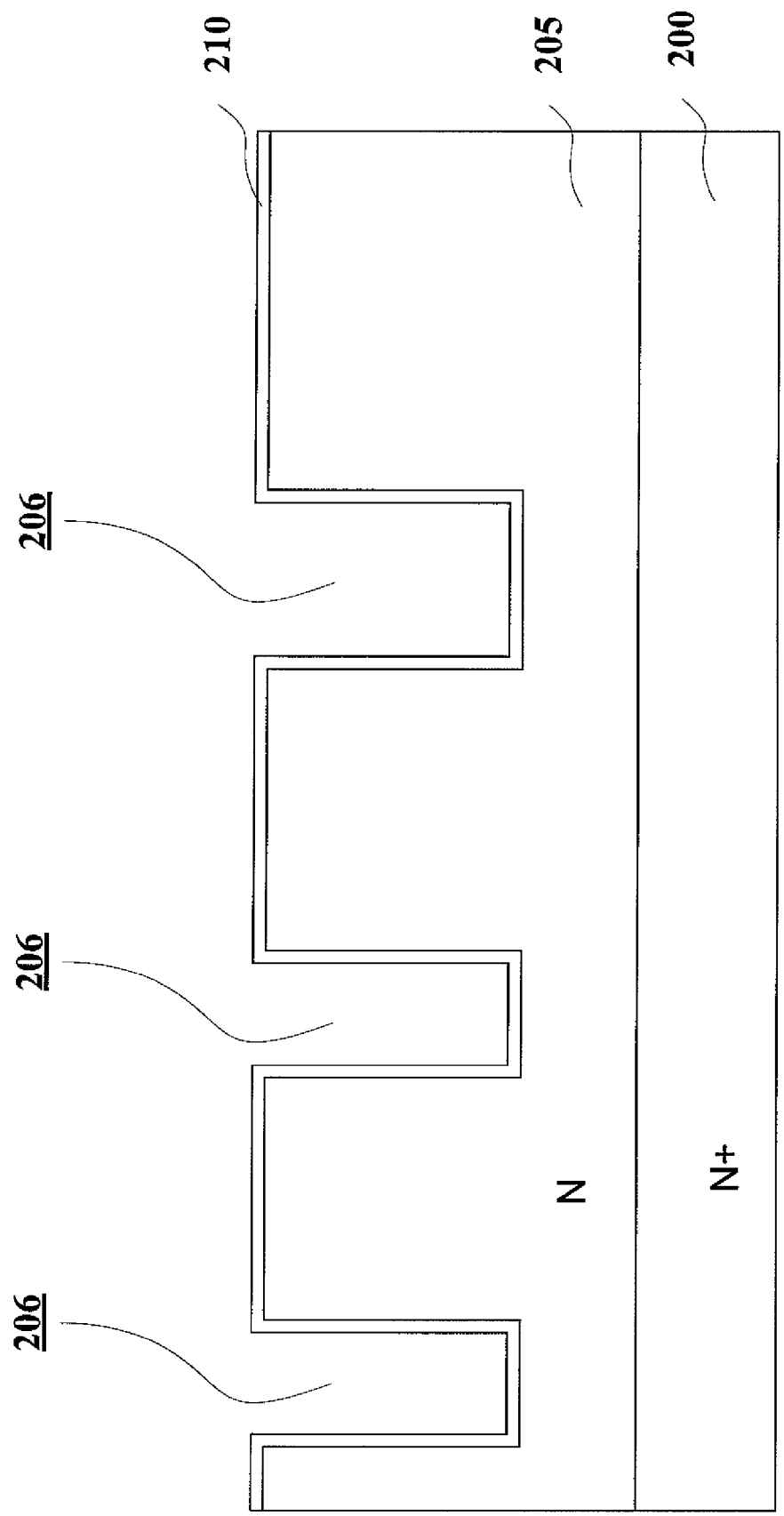
FIGS. 2 to 10 are cross-sectional diagrams illustrating forming a trench MOSFET on a substrate in accordance with an embodiment of the present invention, wherein copper metal layer is used as metal connections for the source/drain and gate regions of the MOSFET.

Referring to FIG. 2, an N+doped substrate 200 having an N-type doping epi layer region 205 thereon is provided. Lithography and dry etching processes are performed to form a plurality of trenches 206 in the N-type epi layer 205. Then, a deposition or thermally grown process is performed to form a silicon oxide layer on the surface of the N-type doping region 205 and the trenches 206, which acts as a gate oxide layer 210 of a trench MOSFET. Prior to the gate oxide layer 210 being formed, a sacrificial oxide is grown and wet etched for removing silicon damage along the trench 206 surface induced by the dry trench etch.

Figure 3:
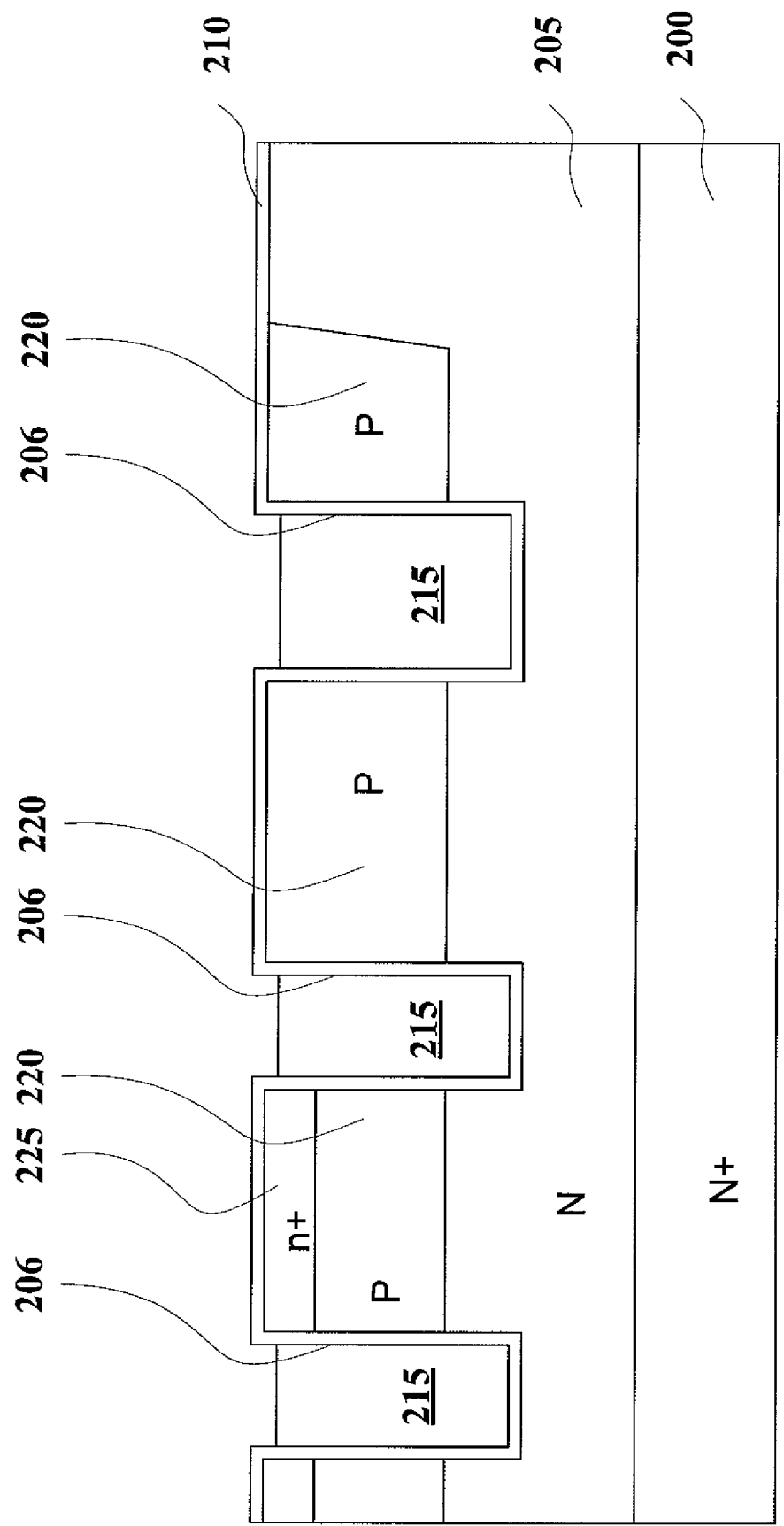

Referring to FIG. 3, a doped polysilicon layer is formed on the gate oxide layer 210 and filled in the trenches 206 by a deposition process. Thereafter, the doped polysilicon layer on the gate oxide layer 210 is removed by a dry etching process or a CMP (chemical-mechanical polishing process), forming a gate structure 215 of the trench MOSFET in the trench. Then, a mask (not shown in FIG. 3) is formed over the gate oxide layer 210 and the gate structure 215 by lithography. Then, P-body regions 220 are formed in the N-type doping region 205 by an ion implantation and diffusion processes. After that, another mask (not shown in FIG. 3) is formed so as to facilitate formation of N+doping regions 225 in the P-body regions 220 by ion implantation and thermal diffusion processes. The N+doping regions 225 are the source regions of the trench MOSFET (hereinafter call source).

Figure 4:
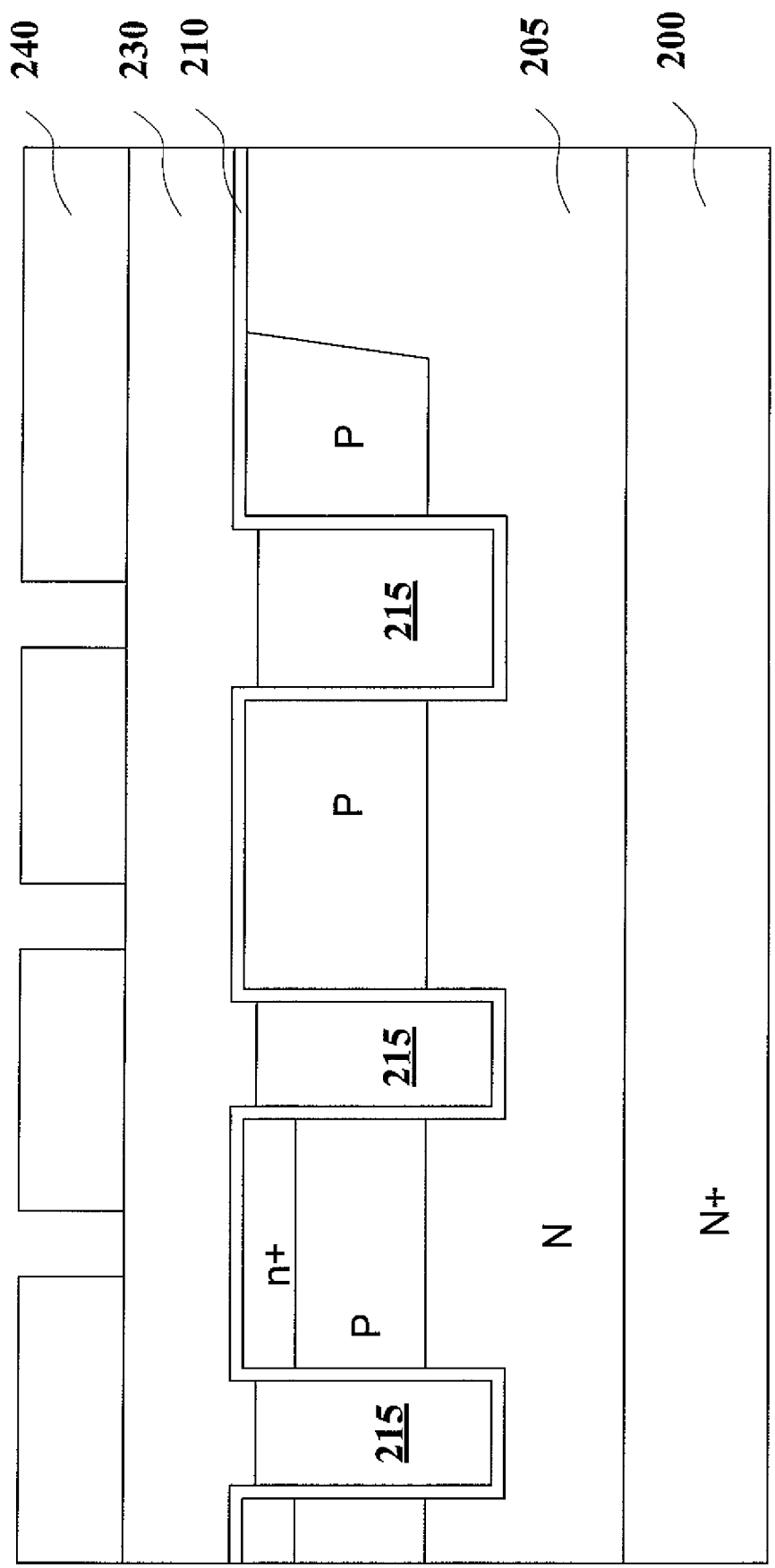

Referring to FIG. 4, an insulating layer 230 is formed on the gate oxide layer 210 and the gate structure 215. This insulating layer 230 is a silicon dioxide layer formed by a deposition process. After the deposition of the insulating layer 230, a first mask 240 is formed on the surface of the insulating layer 230 by lithography. This first mask 240 defines the locations of metal contacts of the trench MOSFET. More particularly, the areas to be formed as metal contacts are exposed from the first mask 240.

Figure 5:
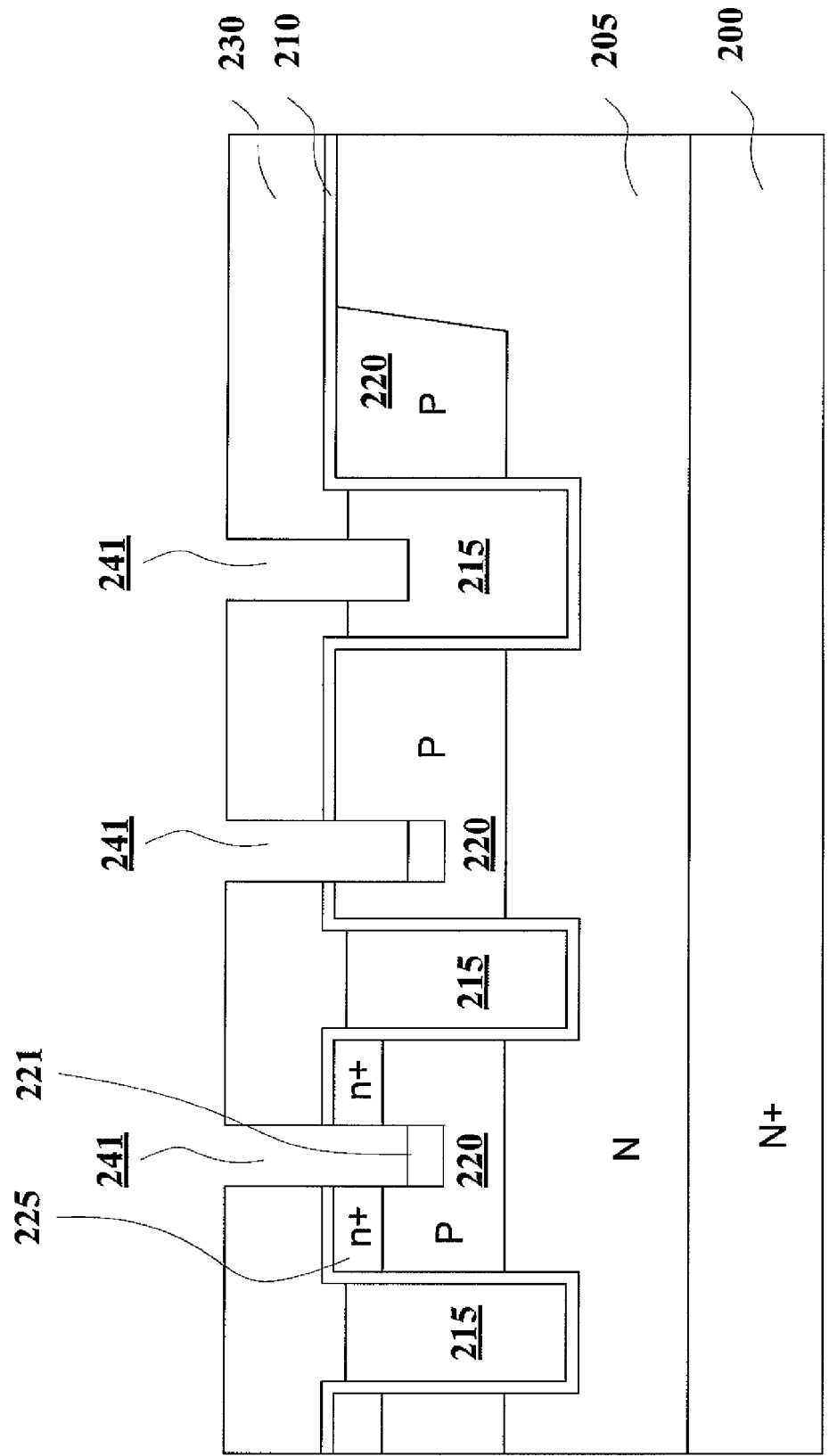

Referring to FIG. 5, a dry etching process is performed by using the first mask 240 shown in FIG. 4 as the etching mask, such that metal contact holes 241 are formed in the insulating layer 230, the N+source 225, the P-body regions 220, and the gate structure 215. The metal contact holes 241 formed in the insulating layer 230, the N+source 225 and the P-body regions 220 are used for a source metal connection. The metal contact holes 241 formed in the insulating layer 230 and the gate structure 215 are used for a gate metal connection. Then, an ion implantation process is carried out to form P+heavily-doped regions 221 at the bottom of the metal contact holes 241.

Figure 6:
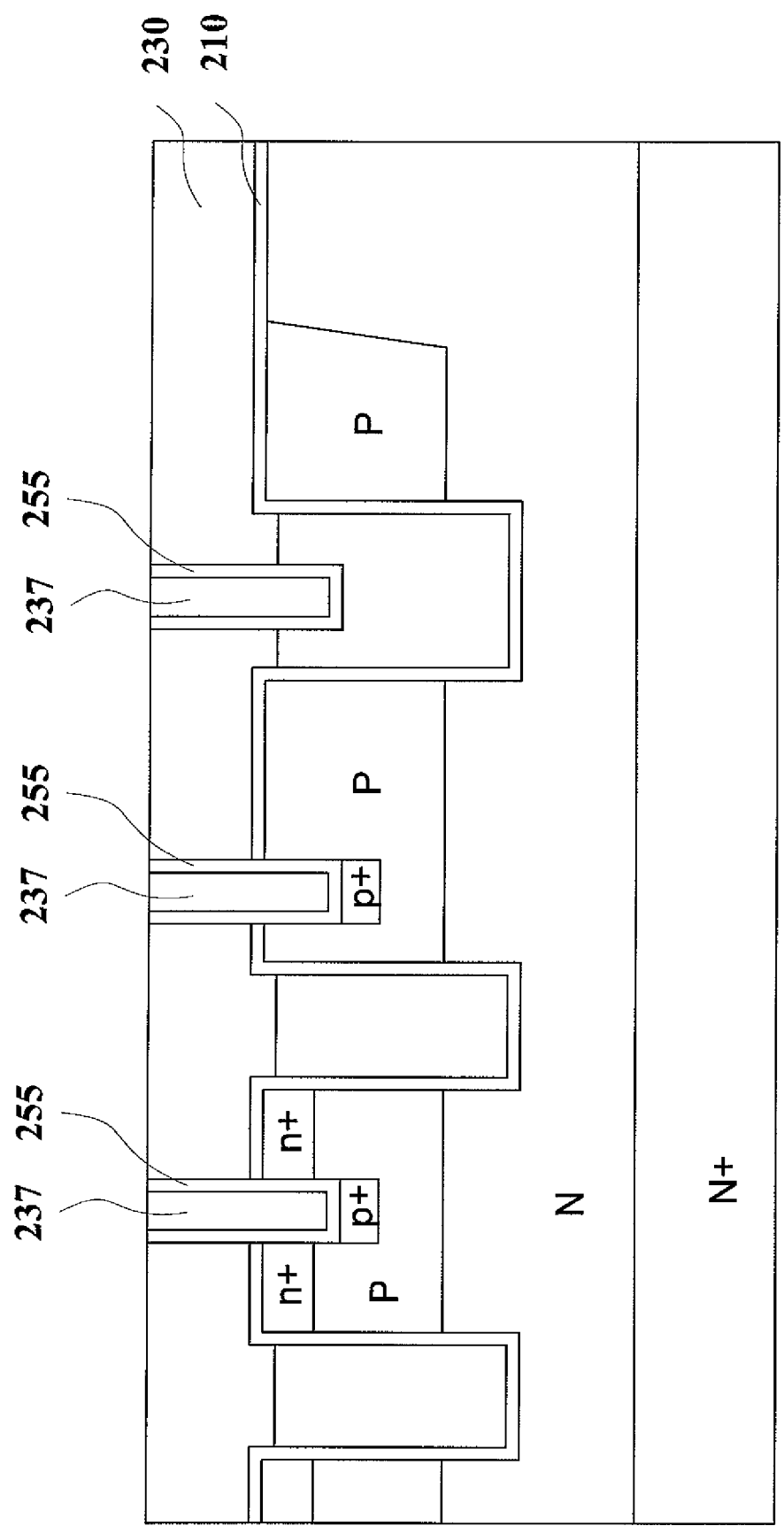

Referring to FIG. 6, a first barrier metal layer 255 is deposited in the metal contact holes 241 and on the surface of the insulating layer 230. Thereafter, a tungsten metal contact layer 237 is deposited by CVD (chemical vapor deposition) at the metal contact hole 241 shown in FIG. 5 and filling the metal contact holes 241, forming metal plugs, i.e. metal connections for the trench MOSFET. According to an embodiment of the present invention, the first barrier metal layer 255 is formed by depositing Ti metal then TiN material (hereinafter call Ti/TiN), or depositing Ta metal then TiN material (hereinafter call Ta/TiN). The tungsten metal contact layer 237 is formed by depositing tungsten metal. After deposition of the tungsten metal contact layer 237 to fill back the metal contact holes 241, the excess tungsten metal contact layer 237 and the first barrier metal layer 255, the parts being over the insulating layer 230, are removed by a CMP process or dry etching to complete the formation of the tungsten metal contact layer 237 of the trench MOSFET.

Figure 7:
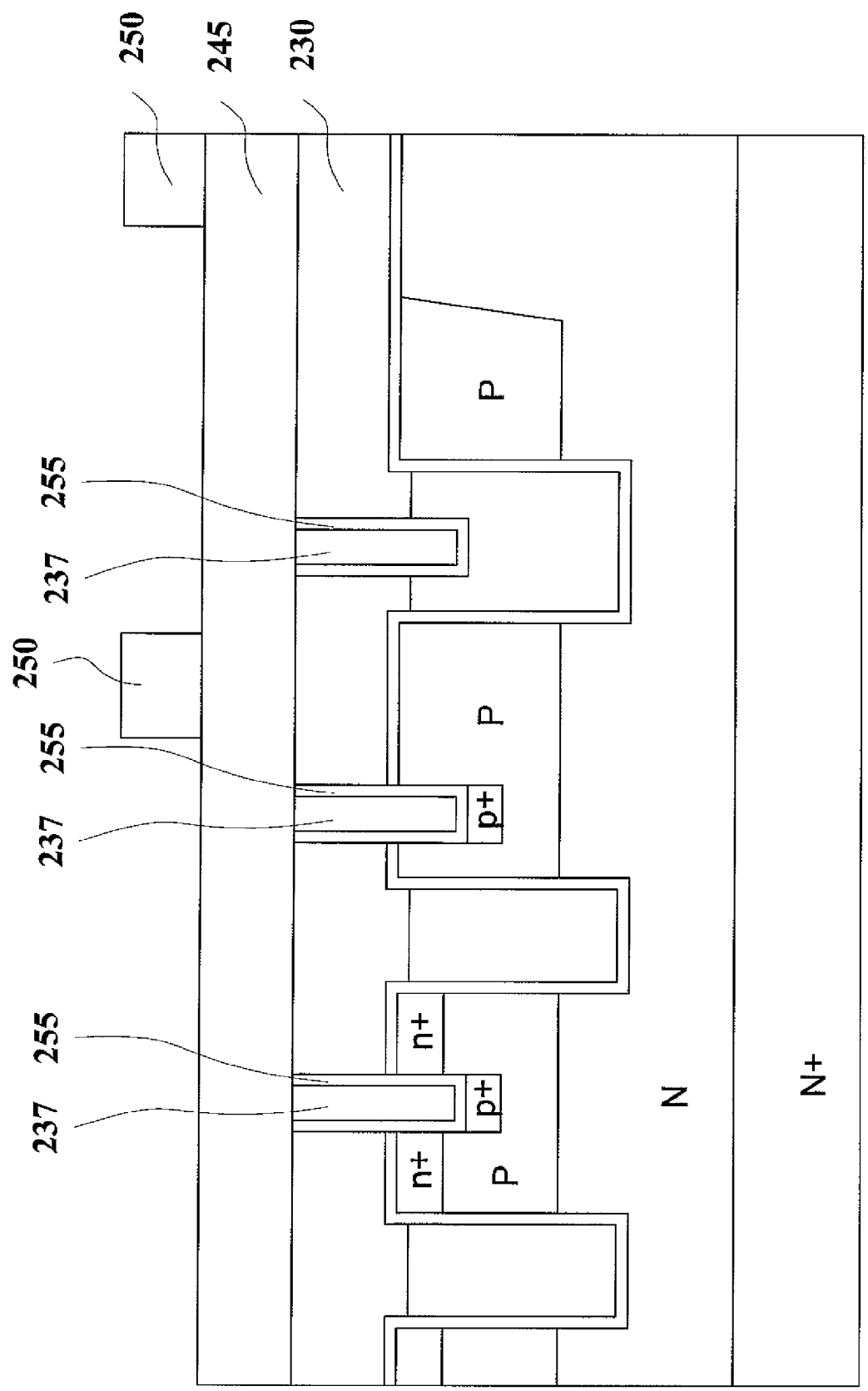

Referring to FIG. 7, a silicon dioxide layer 245 is deposited on the tungsten metal contact layer 237, the first barrier metal layer 255 and the insulating layer 230, and a second mask 250 is defined on the silicon dioxide layer 245.

Figure 8:
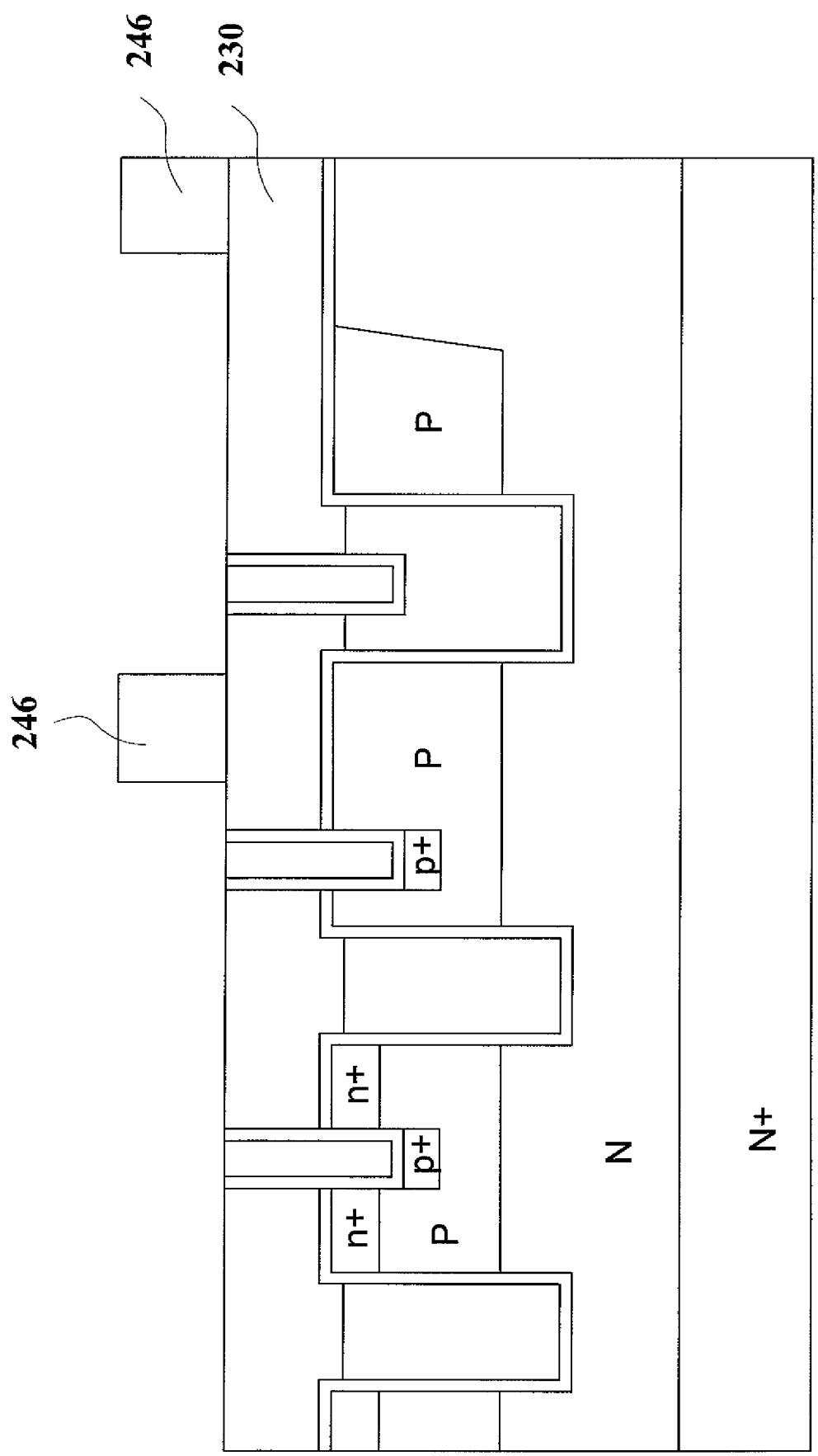

Referring to FIG. 8, a dry etching process is performed by using the metal mask 250 shown in FIG. 7 as the etching mask, such that separating parts 246 are formed on the insulating layer 230.

Figure 9:
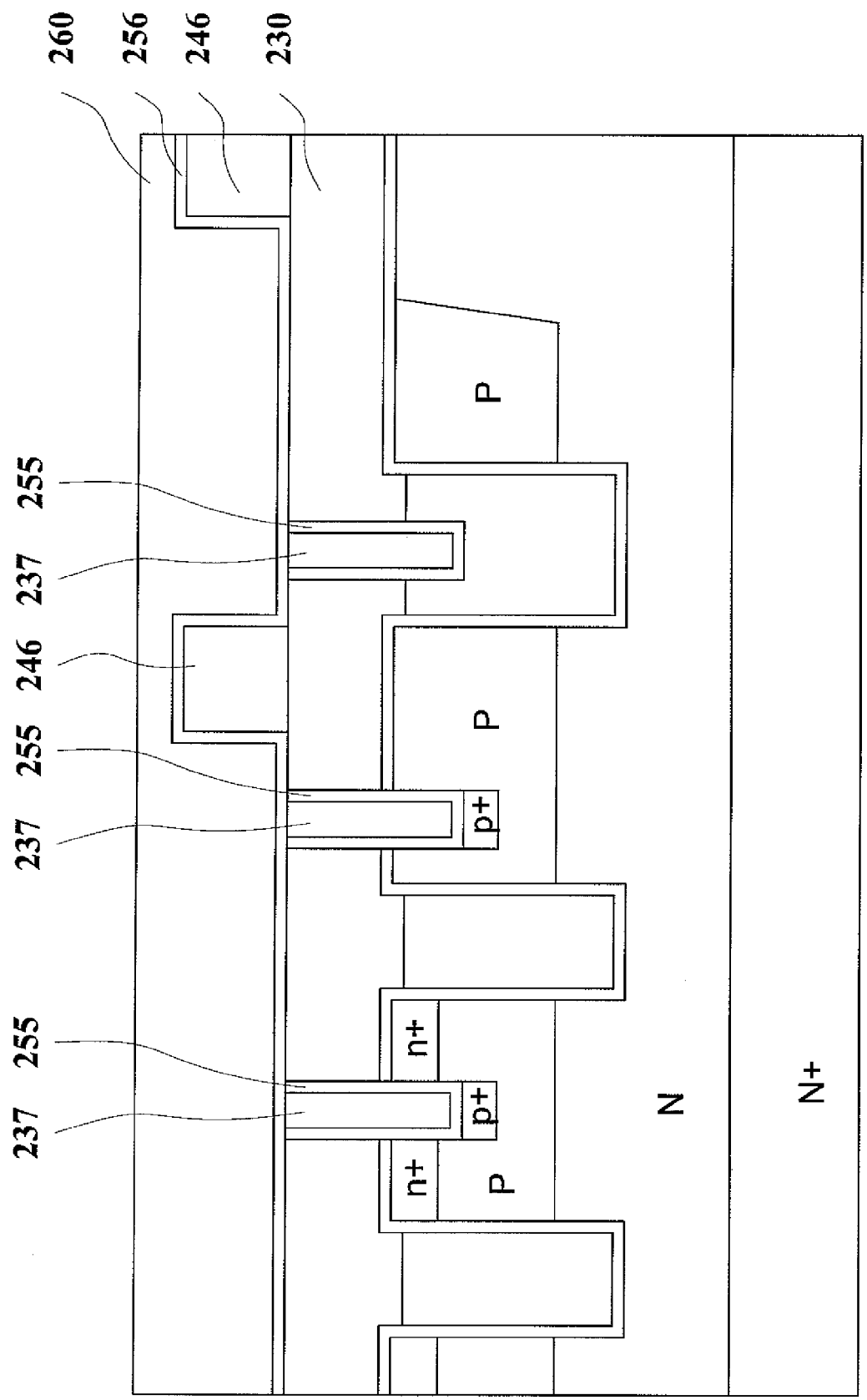

Referring to FIG. 9, a second barrier metal layer 256, formed by Ta or Ta/TaN, is deposited on the tungsten metal contact layer 237, the insulating layer 230, and the separating parts 246. Thereafter, a copper metal layer 260 is deposited on the second barrier metal layer 256 for formation of the source metal layer 260*a* and the gate metal layer 260*b* in FIG. 10.

Figure 10:
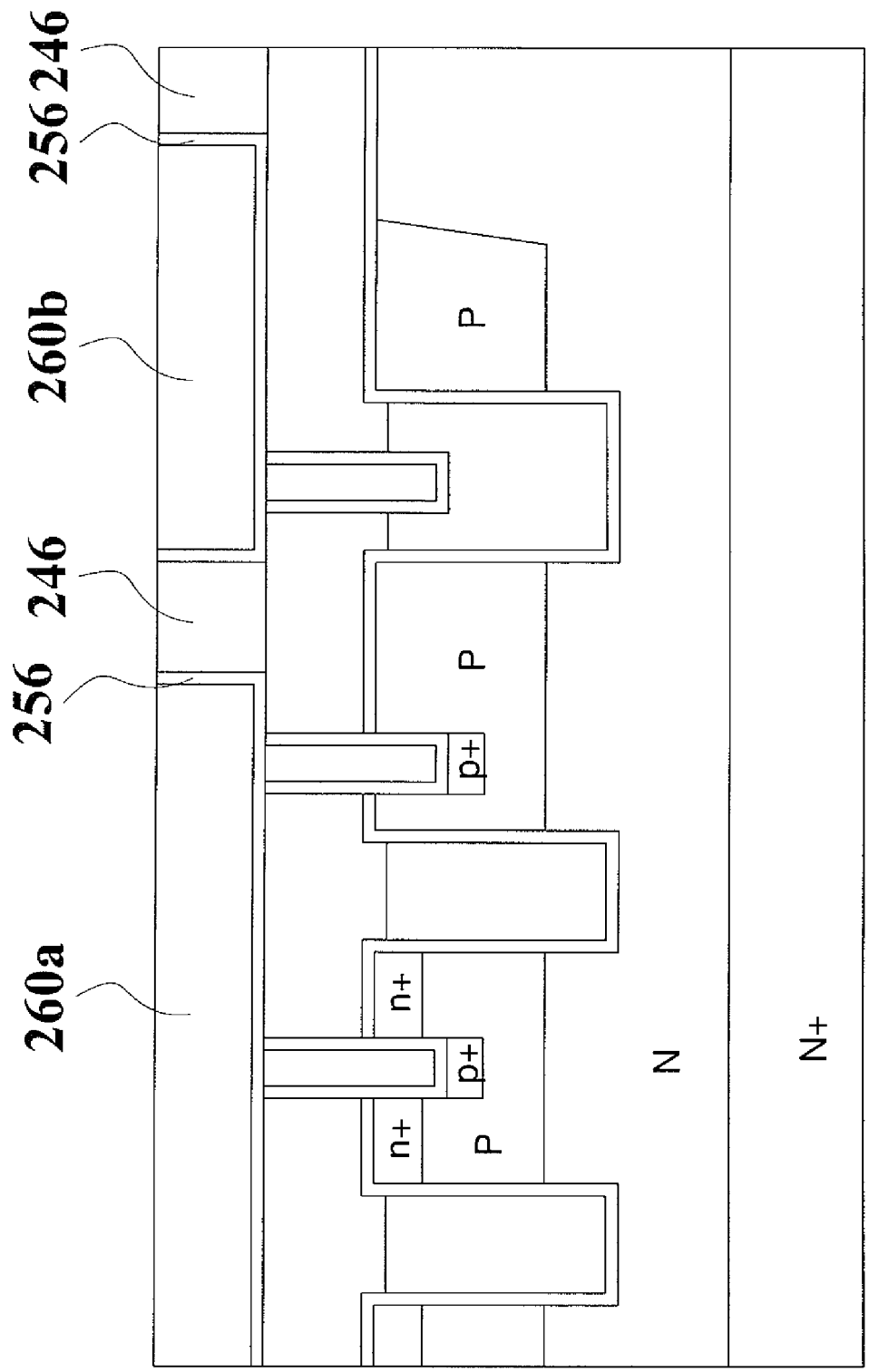

Referring to FIG. 10, the excess second barrier metal layer 256, and copper metal layer 260 are removed by a CMP process to complete the formation of metal connections of the trench MOSFET. The separating parts 246 in FIG. 10 act as separating layers to isolate the source metal layer 260*a* from the gate metal layer 260*b*.

According to the manufacturing processes of a trench MOSFET shown in FIGS. 2 to 10, the first mask 240 and second mask 250 are used to define the locations and pattern of the metal contact holes 241 and metal connections, and, then, tungsten metal are filled back into the metal contact holes 241 to form the metal connections. Instead of forming the metal connections using aluminum metal as in the prior arts, copper metal is used as the front metal layer of the trench MOSFET. The thermal conduction issue for the trench MOSFET is eliminated as the transistor size is reduced, since copper metal has better thermal conductivity.

Although various embodiments are specifically illustrated and described herein, it will be appreciated that modifications and variations of the present invention are covered by the above teachings and are within the purview of the appended claims without departing from the spirit and intended scope of the invention.

I claim:

1. A trench Metal-Oxide-Semiconductor Field Effect Transistor (MOSFET) comprising:
   a plurality of trenches formed on top of an epi layer, wherein the epi layer is formed on a heavily-doped substrate;
   a gate oxide layer formed on sidewalls and bottoms of the plurality of trenches;
   a conductive layer filled in the plurality of trenches to be used as a gate structure of the MOSFET;
   a plurality of source and body regions formed in the epi layer;
   an insulating layer deposited on the epi layer formed with a plurality of metal contact holes therein;
   a separating part formed on the insulating layer, wherein the separating part includes a bottom surface abutting with the insulating layer, a top surface opposite to the bottom surface, and a peripheral surface extending between the top and bottom surfaces;
   a metal contact layer filled in the plurality of metal contact holes, wherein at least one of the plurality of metal contact holes with the metal contact layer filled therein is formed in the conductive layer for contacting the gate structure, and at least another one of the plurality of metal contact holes with the metal contact layer filled therein is formed for contacting respective source and body regions;
   a first barrier metal layer formed on sidewalls and bottoms of the plurality of metal contact holes in direct contact with respective source and body regions and the gate structure;
   a second barrier metal layer formed on the insulating layer and on sidewalls of the separating part, with the second barrier metal layer formed on the peripheral surface of the separating part;
   a copper metal layer formed on the second barrier layer and on the sidewalls of the separating part, with the metal contact layer forming source and gate metal layers of the MOSFET, wherein the source metal layer is connected to respective source and body regions through the metal contact layer filled in the at least another one of the plurality of metal contact holes, the gate metal layer is connected to the gate structure through the metal contact layer filled in the at least one of the plurality of metal contact holes, and the source metal layer is separated from the gate metal layer by the separating part, with the top surface of the separating part being free of the second barrier metal layer and the copper metal layer.

2. The trench MOSFET according to claim 1, wherein the epi layer is an N-type doping epi layer, and the heavily-doped substrate is a heavily-doped N-type substrate for the N-channel MOSFET.

3. The trench MOSFET according to claim 1, wherein the epi layer is a P-type doping epi layer, and the heavily-doped substrate is a heavily-doped P-type substrate for the P-channel MOSFET.

4. The trench MOSFET according to claim 1, wherein the insulating layer is made of silicon dioxide layer.

5. The trench MOSFET according to claim 1, wherein the first barrier metal layer is formed by depositing Ti or Ta metal first, and then depositing TiN or TaN material.

6. The trench MOSFET according to claim 1, wherein the second barrier metal layer is formed by depositing Ta metal, or formed by depositing Ta then TaN material.

7. The trench MOSFET according to claim 1, wherein the gate oxide layer in the plurality of trenches is of a single oxide of which an oxide thickness is uniform along the sidewalls and bottoms of the plurality of trenches.

8. The trench MOSFET according to claim 1, wherein the gate oxide layer at the bottoms of the plurality of trenches has a larger thickness than that at the sidewalls of the plurality of trenches so as to reduce the capacitance of the gate oxide layer.

9. The trench MOSFET according to claim 1, further comprising:
a plurality of heavily-doped regions disposed at the bottoms of the plurality of metal contact holes.

10. A method for manufacturing a trench MOSFET comprising:
providing an epi layer on a heavily-doped substrate;
forming a plurality of trenches in the epi layer;
covering a gate oxide layer on sidewalls and bottoms of the plurality of trenches;
forming a conductive layer in the plurality of trenches to be used as a gate structure of MOSFET;
forming a plurality of source and body regions in the epi layer;
forming an insulating layer on the epi layer;
a separating part formed on the insulating layer, wherein the separating part includes a bottom surface abutting with the insulating layer, a top surface opposite to the bottom surface, and a peripheral surface extending between the top and bottom surfaces;
forming a plurality of metal contact holes in the insulating layer and the plurality of source and body regions;
forming a metal contact layer filled in the metal contact holes, wherein at least one of the plurality of metal contact holes with the metal contact layer filled therein is formed in the conductive layer for contacting the gate structure, and at least another one of the plurality of metal contact holes with the metal contact layer filled therein is formed for contacting respective source and body regions;
forming a first barrier metal layer on sidewalls and bottoms of the plurality of metal contact holes in direct contact with respective source and body regions and the gate structure;
forming a second barrier metal layer on the insulating layer and on sidewalls of the separating part, with the second barrier metal layer formed on the peripheral surface of the separating part; and
forming a copper metal layer on the second barrier metal layer and on the sidewalls of the separating part, with the metal contact layer, forming source and gate metal layers of the MOSFET, wherein the source metal layer is connected to respective source and body regions through the metal contact layer filled in the at least another one of the plurality of metal contact holes, the gate metal layer is connected to the gate structure through the metal contact layer filled in the at least one of the plurality of metal contact holes, and the source metal layer is separated from the gate metal layer by the separating part, with the top surface of the separating part being free of the second barrier metal layer and the copper metal layer.

11. The method according to claim 10, wherein the epi layer is an N-type doping epi layer, and the heavily-doped substrate is a heavily-doped N-type substrate for the N-channel MOSFET.

12. The method according to claim 10, wherein the epi layer is a P-type doping epi layer, and the heavily-doped substrate is a heavily-doped P-type substrate for the P-channel MOSFET.

13. The method according to claim 10, wherein the insulating layer is made of silicon dioxide layer.

14. The method according to claim 10, wherein the first barrier metal layer is formed by depositing Ti or Ta metal first, and then depositing TiN or TaN material.

15. The method according to claim 10, wherein the second barrier metal layer is formed by depositing Ta metal, or formed by depositing Ta then TaN material.

16. The method according to claim 10, wherein the gate oxide layer in the plurality of trenches is a single oxide of which an oxide thickness is uniform along the sidewalls and bottoms of the plurality of trenches.

17. The method according to claim 10, wherein the gate oxide layer at the bottoms of the plurality of trenches has a larger thickness than that at the sidewalls of the plurality of trenches so as to reduce the capacitance of the gate oxide layer.

18. The method according to claim 10, further comprising:
forming a plurality of heavily-doped regions disposed at the bottoms of the plurality of metal contact holes.

* * * * *